United States Patent
Hsieh et al.

(10) Patent No.: US 7,928,455 B2
(45) Date of Patent: *Apr. 19, 2011

(54) SEMICONDUCTOR LIGHT-EMITTING DEVICE AND METHOD FOR FORMING THE SAME

(75) Inventors: Min-Hsun Hsieh, Hsin-Chu (TW); Chia-Fen Tsai, Hsin-Chu (TW)

(73) Assignee: Epistar Corporation, Hsin-Chu (TW)

( * ) Notice: Subject to any disclaimer, the term of this patent is extended or adjusted under 35 U.S.C. 154(b) by 104 days.

This patent is subject to a terminal disclaimer.

(21) Appl. No.: 11/160,588

(22) Filed: Jun. 29, 2005

(65) Prior Publication Data

US 2005/0263776 A1 Dec. 1, 2005

Related U.S. Application Data

(63) Continuation-in-part of application No. 10/604,245, filed on Jul. 4, 2003, now Pat. No. 6,987,287.

(30) Foreign Application Priority Data

Jul. 15, 2002 (TW) ............... 91114688 A
Sep. 1, 2004 (TW) ............... 93126439 A (51) Int. Cl.
*H01L 33/00* (2010.01)
(52) U.S. Cl. ....... 257/98; 257/88; 257/99; 257/E33.061; 257/E33.068
(58) Field of Classification Search ............ 257/79, 257/E33.061, E33.068, E33.062, 99, 88, 257/E33.06; 438/48

See application file for complete search history.

(56) References Cited

U.S. PATENT DOCUMENTS

| | | | |
|---|---|---|---|
| 5,207,864 A | 5/1993 | Bhat et al. | |
| 5,376,580 A | 12/1994 | Kish et al. | |
| 5,502,316 A | 3/1996 | Kish et al. | |
| 5,783,477 A | 7/1998 | Kish, Jr. et al. | |
| 5,798,536 A | 8/1998 | Tsutsui | |
| 5,952,681 A * | 9/1999 | Chen ............................. | 257/89 |
| 6,057,562 A * | 5/2000 | Lee et al. ....................... | 257/96 |

(Continued)

FOREIGN PATENT DOCUMENTS

DE 10118447 A1 5/2002
(Continued)

OTHER PUBLICATIONS

R. H. Horng et al, AlGaEnP light-emitting diodes with mirror substrates fabricated by wafer bonding., Appfied Physics Letters, Nov. 15, 1999, pp. 3054-3056, vol. 75, No. 20, Amedcan Institute of Physics, USA.*

(Continued)

*Primary Examiner* — Wael M Fahmy
*Assistant Examiner* — Sarah K Salerno
(74) *Attorney, Agent, or Firm* — Finnegan, Henderson, Farabow, Garrett & Dunner, LLP (57) ABSTRACT

A semiconductor light-emitting device includes a light-impervious substrate, a bonding structure, a semiconductor light-emitting stack, and a fluorescent material structure overlaying the semiconductor light-emitting stack. The semiconductor light-emitting stack is separated from a growth substrate and bonded to the light-impervious substrate via the bonding structure. A method for producing the semiconductor light-emitting device includes separating a semiconductor light-emitting stack from a growth substrate, bonding the semiconductor light-emitting stack to a light-impervious substrate, and forming a fluorescent material structure over the semiconductor light-emitting stack.

4 Claims, 5 Drawing Sheets

U.S. PATENT DOCUMENTS

| | | |
|---|---|---|
| 6,180,963 B1 | 1/2001 | Arai |
| 6,222,207 B1 | 4/2001 | Carter-Coman et al. |
| 6,245,259 B1 * | 6/2001 | Hohn et al. ............... 252/301.36 |
| 6,287,882 B1 * | 9/2001 | Chang et al. ..................... 438/29 |
| 6,320,206 B1 | 11/2001 | Coman et al. |
| 6,396,082 B1 * | 5/2002 | Fukasawa et al. ............... 257/79 |
| 6,416,194 B1 | 7/2002 | Demiryont |
| 6,417,019 B1 | 7/2002 | Mueller et al. |
| 6,458,612 B1 | 10/2002 | Chen et al. |
| 6,525,335 B1 | 2/2003 | Krames et al. |
| 6,576,930 B2 | 6/2003 | Reeh et al. |
| 6,597,019 B2 | 7/2003 | Inoue et al. |
| 6,627,921 B2 * | 9/2003 | Wong et al. ..................... 257/79 |
| 6,642,652 B2 | 11/2003 | Collins, III et al. |
| 6,650,044 B1 | 11/2003 | Lowery |
| 6,682,950 B2 | 1/2004 | Yang et al. |
| 6,709,883 B2 | 3/2004 | Yang et al. |
| 6,734,465 B1 * | 5/2004 | Taskar et al. .................... 257/80 |
| 6,800,500 B2 | 10/2004 | Coman et al. |
| 2001/0004112 A1 * | 6/2001 | Furukawa et al. ................. 257/7 |
| 2002/0011601 A1 * | 1/2002 | Furukawa et al. ............... 257/98 |
| 2002/0053872 A1 | 5/2002 | Yang et al. |
| 2002/0067125 A1 * | 6/2002 | Nogaki et al. ................. 313/510 |
| 2002/0079506 A1 * | 6/2002 | Komoto et al. ................. 257/99 |
| 2002/0080838 A1 | 6/2002 | Orita et al. |
| 2002/0093287 A1 * | 7/2002 | Chen .............................. 313/512 |
| 2002/0105003 A1 * | 8/2002 | Yang et al. ....................... 257/94 |
| 2003/0040133 A1 | 2/2003 | Horng et al. |
| 2003/0087463 A1 * | 5/2003 | Horng et al. .................... 438/29 |
| 2003/0155579 A1 | 8/2003 | Yang |
| 2003/0168664 A1 | 9/2003 | Hahn et al. |
| 2004/0124428 A1 | 7/2004 | Lin et al. |

FOREIGN PATENT DOCUMENTS

| | | |
|---|---|---|
| JP | 52-23986 | 6/1977 |
| JP | 57-10280 | 1/1982 |
| JP | 8-330624 | 12/1996 |
| JP | 11-168236 | 6/1999 |
| JP | 2000-91628 | 3/2000 |
| JP | 2000091628 A1 | 3/2000 |
| JP | 2000-228563 | 8/2000 |

OTHER PUBLICATIONS

Chen-Fu Chu et al., Fabrication and characteristics of freestanding GaN light emitting devices by laser lift-off technique.

F. S. Shieu et al., Effect of ø TI Interlayer on the bond strength and thermal stability of the Cu/benzocyclobutene- divinyl tetramethyldlalloxene interface. J. Adhesion Sol. Technol., 1998, p.19-28, vol. 12, No. 1, VSP, Netherlands.

R. H. Horng at el., AlGaInP light-emitting diodes with mirror substrates fabricated by wafer bonding., Applied Physics Letters, Nov. 15, 1999, pp. 3054-3056, vol. 75, No. 20, American Institute of Physics, USA.

G. Dang et al., Comparison of Dry and Wet Etch Processes for Patterning SiO2/TiO2 Distributed Bragg Reflectors for Vertical-Cavity Surface-Emitting Lasers., Journal of the Electrochemical Society, 2001, G25-G28. vol. 148(2), The Electrochemical Society, Inc. NJ, USA.

T. Margalith et al., Indiumlin oxide contacts to gallium nitride optoelectronlc devices., Applied Physics Letters, Jun. 28, 1999, pp. 3930-3932, vol. 74. No. 28, American Institute of Physics, USA.

R. H. Horng et el, "AlGaInP light-emitting diodes with mirror substrates fabricated by wafer bontfing." Appl. Phys. Lett., Nov. 15, 1999, pp. 3054-3056, vol. 75, No. 20.

Chua, C. L. et al., "Dielectrically-Bonded Long Wavelength Vertical Cavity Laser on GaAs Substrates Using Strain-Compensated Multiple Quantum Wells," IEEE Photonics Technology Letters, vol. 6, No. 12, pp. 1400-1402, Dec. 1994.

* cited by examiner

SEMICONDUCTOR LIGHT-EMITTING DEVICE AND METHOD FOR FORMING THE SAME

CROSS REFERENCE TO RELATED APPLICATIONS

This is a continuation-in-part of application Ser. No. 10/604,245, filed Jul. 4, 2003, and which is included in its entirety herein by reference.

BACKGROUND OF THE INVENTION

1. Field of the Invention

The present invention relates to a semiconductor light-emitting device, and more particularly, to a semiconductor light-emitting device having a fluorescent material structure.

2. Description of the Prior Art

Semiconductor light-emitting devices, such as light-emitting diodes (LEDs) and laser diodes (LDs), are characterized by small size, good emitting efficiency, long life-span, high reaction speed, good reliability, and excellent monochromaticity, and have been used widely in electronic devices, cars, signages, and traffic lights. With the achievement of full color LEDs, LEDs have gradually replaced traditional illumination devices, such as fluorescent lamps and incandescent bulbs.

In the past, the white light is usually achieved by using the structure of light-emitting diode chip and fluorescent material, such as fluorescent powder. The fluorescent material is excited by blue light and then emits yellow, or green and red light. The mixture of blue and yellow light; or of blue, green, and red light may generate white light. Nowadays the substrate of a white light-emitting diode is generally made of sapphire ($Al_2O_3$), SiC, or other transparent substrate. In order to ensure that the light emitted by the light-emitting diode will pass through the fluorescent material (fluorescent powder) and blend into the required color, the fluorescent material must entirely cover all the possible light emitted by the light-emitting diode.

However, it is difficult to evenly overlay the fluorescent material around the transparent substrate or the light-emitting diode chip. When the light generated by the light-emitting diode travels through the uneven fluorescent material, the thicker portion of the fluorescent material absorbs more light than the thinner one does. Therefore, the light-emitting diode will display different colors in different directions corresponding to different thicknesses of the fluorescent material. U.S. Pat. No. 6,642,652, which is included herein by reference, discloses a flip-chip light-emitting device having fluorescent material. The patent teaches complicated methods, such as electrophoresis, for evenly covering the light-emitting device with fluorescent material. However, the disclosed methods involve increases in the cost and decreases in the yield of the light-emitting device. Furthermore, the patent cannot achieve a simple solution to the problem of uneven thickness of the fluorescent material over an LED chip.

To avoid the above-mentioned problems, the present invention provides a semiconductor light-emitting device and manufacturing method thereof. Before chip packaging, a fluorescent material structure is formed over the wafer or the chip to avoid color variation caused by uneven thickness of the fluorescent material over the chip.

SUMMARY OF THE INVENTION

It is therefore an object of the invention to provide a semiconductor light-emitting device and related method to avoid the above-mentioned problems.

The semiconductor light-emitting device of the claimed invention comprises a light-impervious substrate, a bonding structure, a semiconductor light-emitting stack, and a fluorescent material structure overlaying the semiconductor light-emitting stack and being substantially in contour conformity with the semiconductor light-emitting stack. The semiconductor light-emitting stack is separated from a growth substrate, and is bonded to the light-impervious substrate via the bonding structure. The fluorescent material structure comprises a fluorescent material for absorbing original light emitted from the semiconductor light-emitting stack and generating converted light.

The bonding structure of invention further comprises a first intermediate layer, an adhesive layer, and/or a second intermediate layer. The bonding structure can increase the bonding strength or electrically connect the semiconductor light-emitting stack and the light-impervious substrate.

The fluorescent material structure of the invention comprises a fluorescent material, which is directly formed over the semiconductor light-emitting stack, or mixed with a binder and then formed over the semiconductor light-emitting stack.

The method for forming a semiconductor light-emitting device comprises steps of separating a semiconductor light-emitting stack from a growth substrate, bonding the semiconductor light-emitting stack to the light-impervious substrate, and form a fluorescent material structure over the semiconductor light-emitting stack.

These and other objectives of the present invention will no doubt become obvious to those of ordinary skill in the art after reading the following detailed description of the preferred embodiment that is illustrated in the various figures and drawings.

DETAILED DESCRIPTION

Embodiment 1

Figure 1:
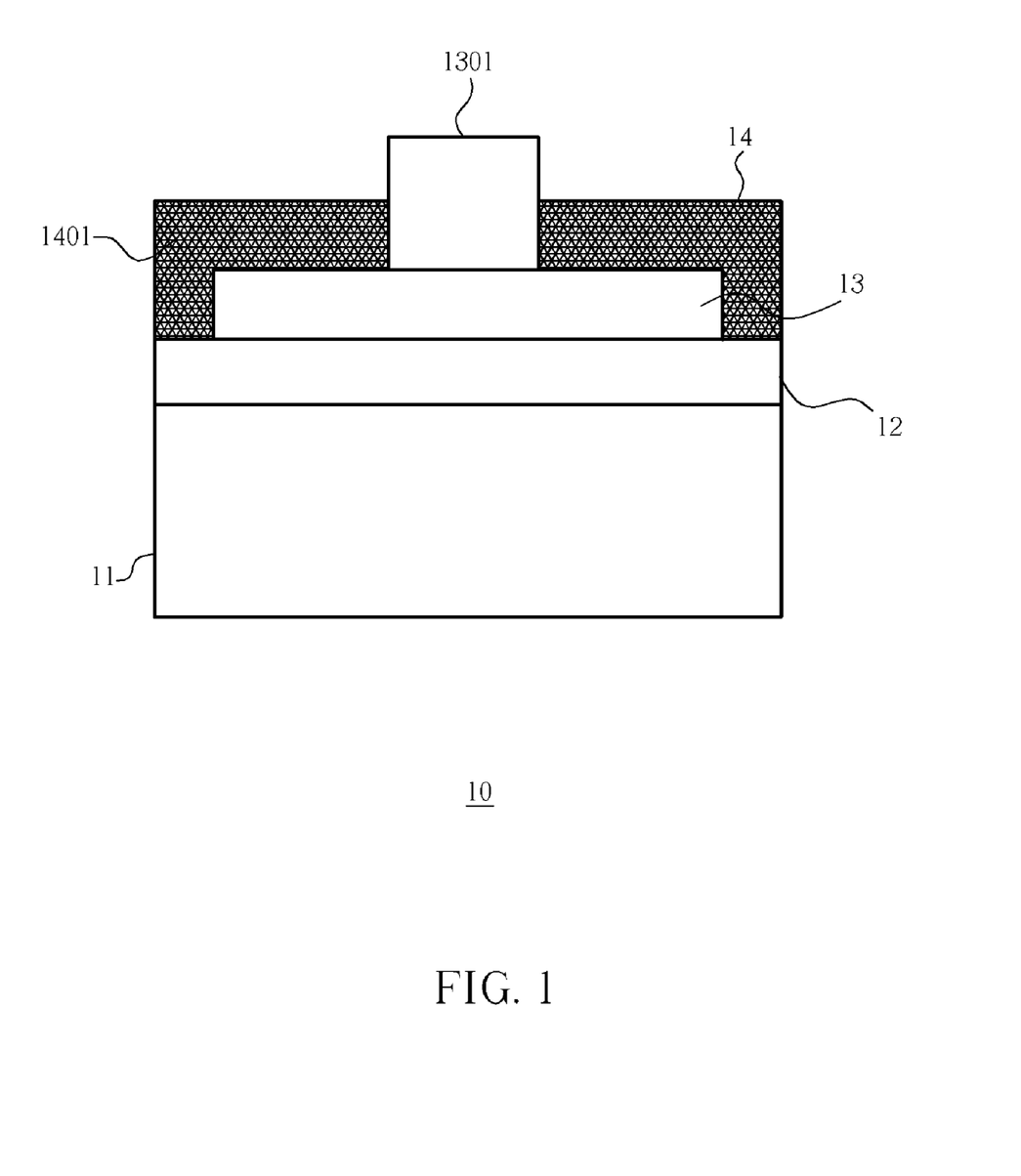
FIGS. 1 to 3 shows front views of an embodiment of the semiconductor light-emitting device according to the present invention.
Figure 2:
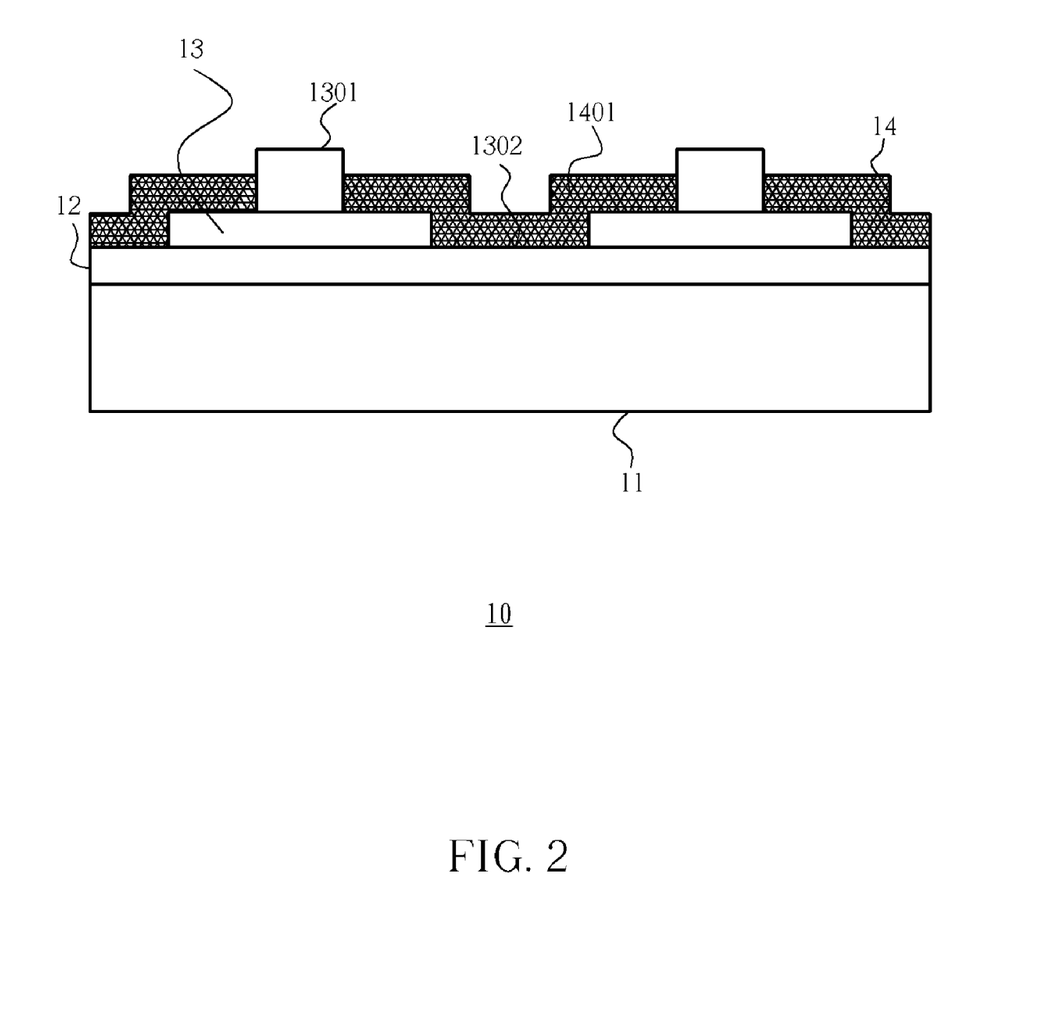
Figure 3:
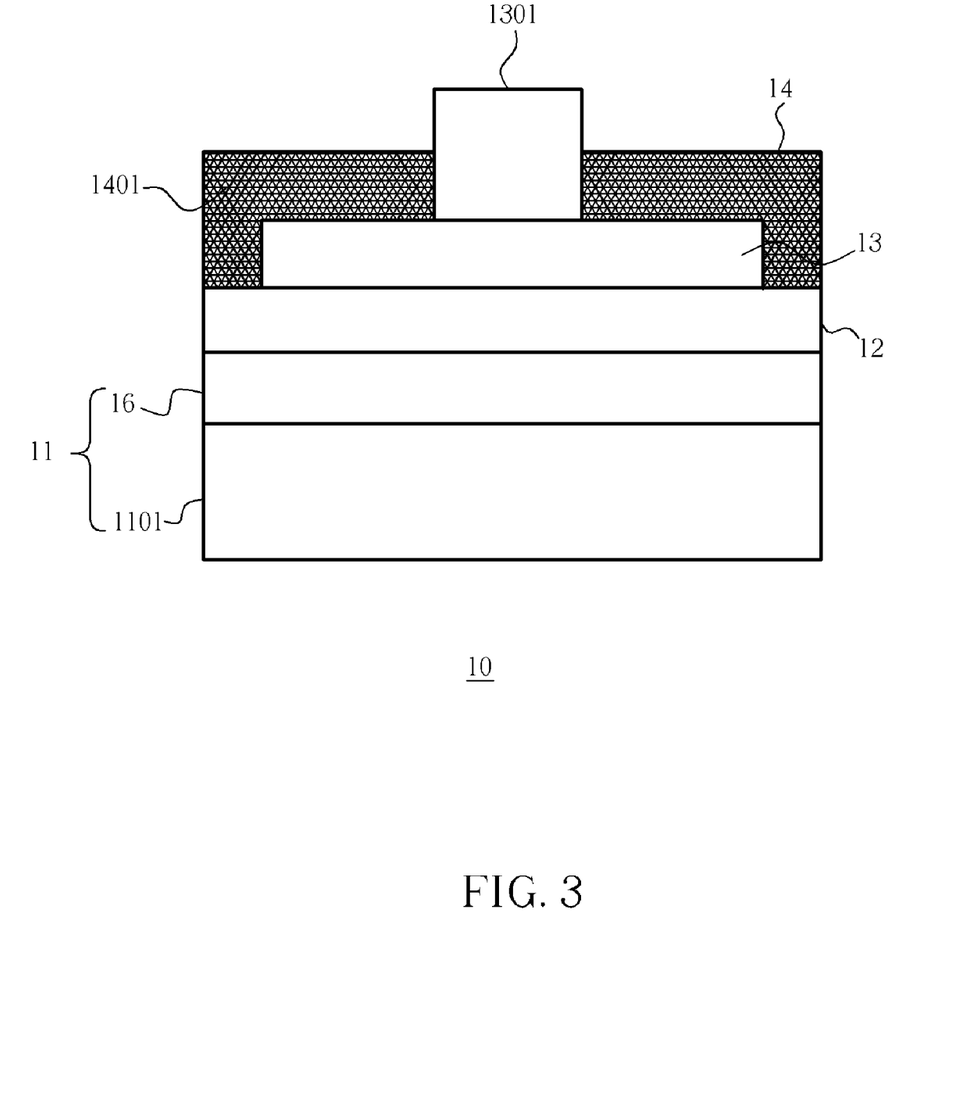

Referring to FIGS. 1 to 3, a semiconductor light-emitting device 10 includes a light-impervious substrate 11, a bonding structure 12, a semiconductor light-emitting stack 13, and a fluorescent material structure 14. The semiconductor light-emitting stack 13 can be subject to a biased current to emit original light, such as the blue light for GaN based light-emitting diode. Since light cannot penetrate the light-impervious substrate 11, the light will move towards the side opposite to the light-impervious substrate 11, i.e., the side of the fluorescent material structure 14. When the original light enters the fluorescent material structure 14, a fluorescent material 1401 inside the fluorescent material structure 14 absorbs original light and is excited to generate converted light which has a wavelength different from that of the original light. The original light and the converted light may mix up to white light preferably. The semiconductor light-emitting stack 13 of the present invention may be a vertical structure (with electrical connections at the opposite sides), or a horizontal structure (with electrical connections at the same side).

The light-impervious substrate 111 of present invention is a semiconductor substrate, a metal substrate, a combination of above materials, or other light-impervious materials. Preferably, the light-impervious substrate 11 comprises a material selected from a group consisting of Si, GaN/Si, GaAs, and any combination thereof. Otherwise, as shown in FIG. 2, the light-impervious substrate 111 is a wafer having a trench 1302 for partitioning more than two semiconductor light-emitting stacks 13. A suitable way is to dice the semiconductor light-emitting stack 13 after the fluorescent material structure 14 is formed.

As shown in FIG. 3, the light-impervious substrate 11 further has a transparent substrate 1101 and a reflective layer 16. The reflective layer 16 is used for reflecting light moving towards the transparent substrate 1101, such that the original light and/or the converted light will be guided to the fluorescent material structure 14 instead of penetrating the transparent substrate 1101. The transparent substrate 1101 comprises a material selected from a group consisting of GaP, SiC, ZnO, GaAsP, AlGaAs, $Al_2O_3$, glass, and any combination of such.

The bonding structure 12 is used for bonding the light-impervious substrate 11 and the semiconductor light-emitting stack 13. The bonding structure 12 can be metal, such as In, Au, Al, and Ag etc. The metal is formed between the light-impervious substrate 11 and the semiconductor light-emitting stack 13 at a predetermined temperature, such as 200° C.~600° C., and serves as a mirror to reflect light moving towards the light-emitting substrate 11. The bonding structure 12 can also form an ohmic contact between the light-impervious substrate 11 and the semiconductor light-emitting stack 13, so that the light-impervious substrate 11 is electrically connected to the semiconductor light-emitting stack 13.

In other way, the bonding structure 12 can be a region adjacent to an interface where the light-impervious substrate 11 directly contacts the semiconductor light-emitting stack 13. The light-impervious substrate 11 and the semiconductor light-emitting stack 13 are bonded together under an appropriate pressure, such as 200 $g/cm^2$~400 $g/cm^2$, and a higher temperature, such as 500° C.~1000° C., preferably 550° C.~650° C.

The light-impervious substrate 11 and the semiconductor light-emitting stack 13 are preferably glued together by the bonding structure 12. The gluing process is performed at lower temperature, such as 150° C.~600° C., preferably 200° C.~300° C., and a predetermined pressure, such as 328 $g/cm^2$~658 $g/cm^2$, preferably about 505 $g/cm^2$, and thereby reduces high-temperature damage to the semiconductor light-emitting stack 13 and achieves a proper bonding effect. The bonding structure 12 comprises a material such as metal, epoxy, PI, BCB, and PFCB, or other substitutes. Moreover, the bonding structure 12 is a transparent material, such as BCB.

When the light-impervious substrate 111 is electrically connected to the semiconductor light-emitting stack 13, an electrical channel is vertically formed. An electrical connection 1301 of the semiconductor light-emitting device 10 can be disposed over the semiconductor light-emitting stack 13, and the light-impervious substrate 111 serves as another electrical connection. Alternatively, another electrical connection can be formed on the light-impervious substrate 11.

The fluorescent material structure 14 is composed of one or more fluorescent materials 1401 capable of absorbing original light generated by the semiconductor light-emitting stack 13 to generate converted light that has a wavelength different from that of the original light. The converted light may have multiple hues by using multiple fluorescent materials 1401.

Moreover, the fluorescent material structure 14 is formed over the semiconductor light-emitting device 10 and is substantially in contour conformity with the semiconductor light-emitting stack 13 and thereby simplifies the chip packaging procedure. The fluorescent material 1401 can be formed over the semiconductor light-emitting stack 13 via a binder (not shown). The binder and the fluorescent material 1401 are mixed up and then put over the semiconductor light-emitting stack 13. In other way, the binder is applied to the semiconductor light-emitting stack 13, and then the fluorescent material 1401 is deposited over the binder. Furthermore, other structures (not shown), such as a cup or container, over the semiconductor light-emitting stack 13 may be formed to carry, fill, or package the fluorescent material 1401.

Preferably, the fluorescent material structure 14 only includes the fluorescent material 1401, or is a non-glued fluorescent material structure. The non-glued fluorescent material structure 14 here is defined as a lumped fluorescent material containing no binder, epoxy, or other binding material. The method to lump the fluorescent material 1401 together can be used such as sedimentation or other physical deposition process. The bonding strength between the semiconductor light-emitting stack 13 and fluorescent material structure 14 can be further increased by heating and/or compressing the fluorescent material 1401. The use of the non-glued fluorescent material structure 14 avoids light-absorbing by binder or epoxy and thereby provides better light transformation and color performance.

Although the fluorescent material structure 14 of the above embodiment is formed over the semiconductor light-emitting stack 13, it is not necessary that the fluorescent material structure 14 must directly contact the semiconductor light-emitting stack 13. Instead, another structure, such as a protection layer or optical layer, can be formed between the semiconductor light-emitting stack 13 and the fluorescent material structure 14. Additionally, the fluorescent material structure 14 is in a form of powder, like sulfide powder. Preferably, an average diameter of the powder is between 0.1~100 micrometers.

Embodiment 2

Figure 4:
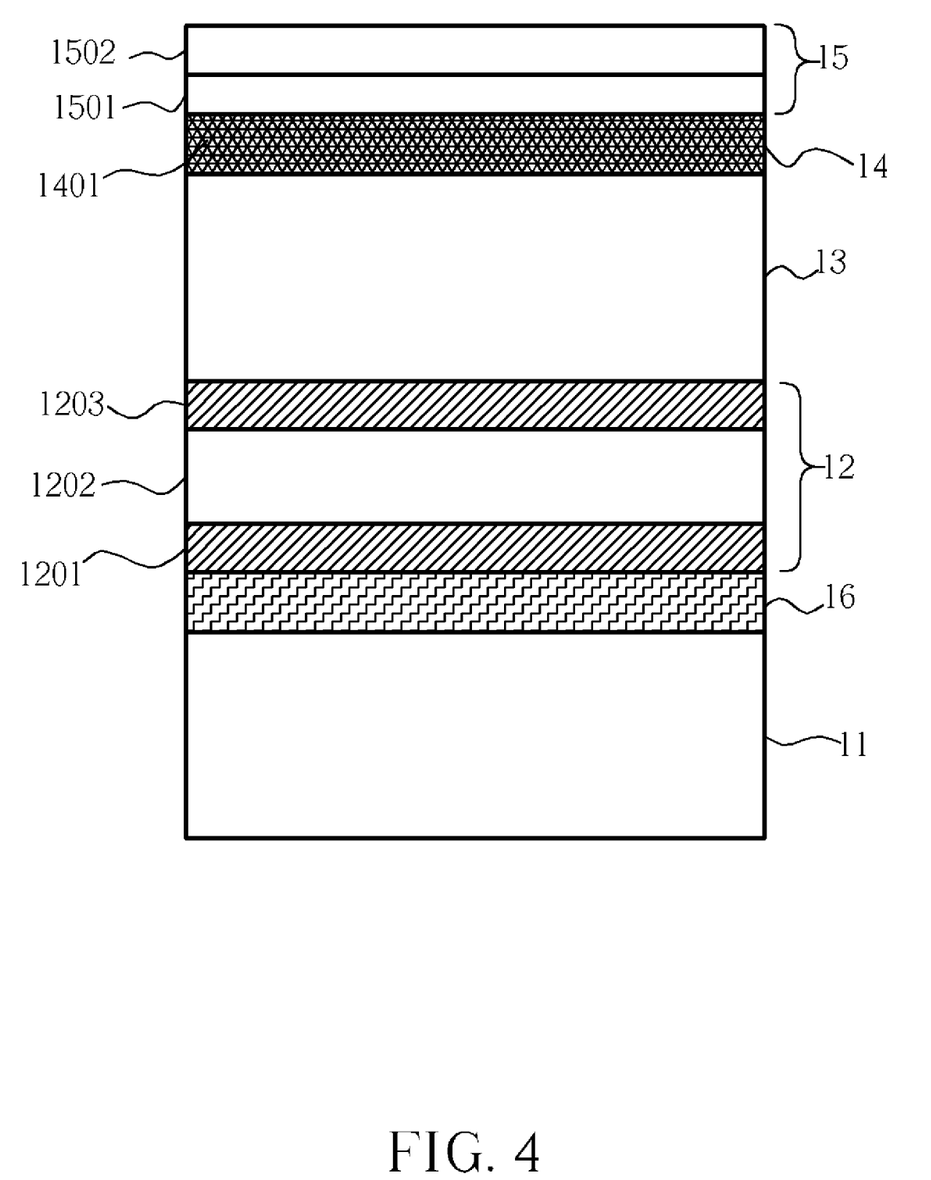
FIGS. 4 and 5 show front views of another embodiment of the semiconductor light-emitting device according to the present invention.
Figure 5:
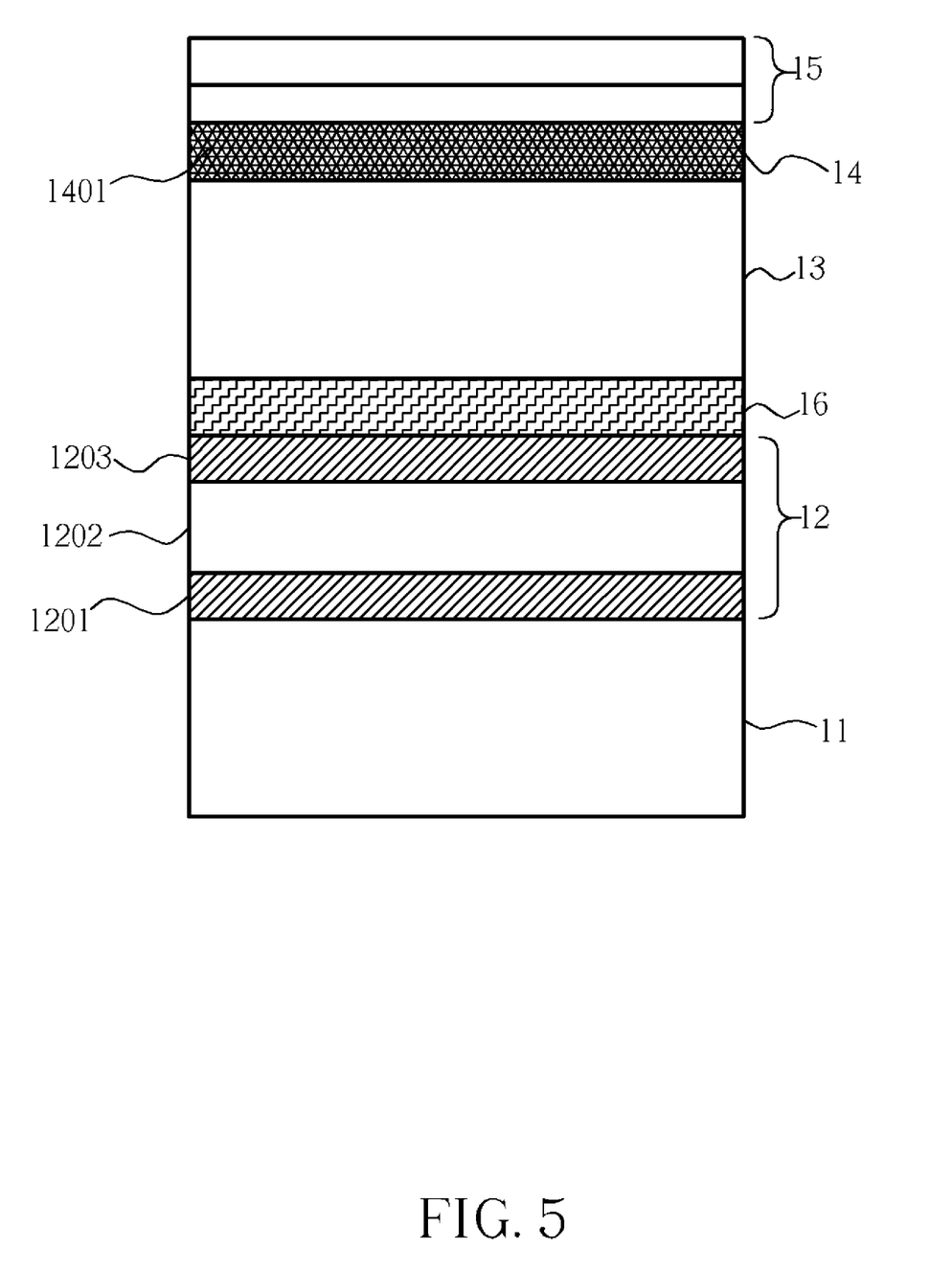

FIGS. 4 and 5 are front views of second embodiment of the present invention. Elements in the second embodiment that are the same as those in the first embodiment have the same denotations, and repeated description of these elements are omitted herein.

As described in the first embodiment, the bonding structure 12 is used for bonding the light-impervious substrate 11 and the semiconductor light-emitting stack 13. In this embodiment, the bonding structure 12 further comprises a first intermediate layer 1201, an adhesive layer 1202 and a second intermediate layer 1203. The first intermediate layer 1201 and the second intermediate layer 1203 are respectively formed over the light-impervious substrate 11 and semiconductor light-emitting stack 13. The adhesive layer 1202 is used to bond the first and second intermediate layers 1201 and 1203. The two intermediate layers 1201 and 1203 are used to increase bonding strength between the adhesive layer 1202 and the light-impervious substrate 11, and between the adhesive layer 1202 and the semiconductor light-emitting stack 13.

The adhesive layer 1202 of the bonding structure 12 is such as epoxy, PI, BCB, PFCB, or other organic adhesive material. The first and second intermediate layers 1201 and 1203 are $SiN_x$, Ti, Cr, or other materials for increasing the bonding strength between the adhesive layer 1202 and the light-impervious substrate 11, and/or between the adhesive layer 1202 and the semiconductor light-emitting stack 13.

As shown in FIGS. 4 and 5, the semiconductor light-emitting device 10 further has a protection structure 15 formed over the fluorescent material structure 14 for protecting the fluorescent material structure 14 and other structures below the fluorescent material structure 14 from humidity, shock, etc. The protection structure 15 comprises a material such as Su8, BCB, PFCB, epoxy, acrylic resin, COC, PMMA, PET, PC, polyetherimide, fluorocarbon polymer, silicone, glass, any combination of above materials, or other materials pervious to light.

The protection structure 15 further includes a plurality of optical layers 1501 and 1502, each optical layer having a different thickness. Each thickness of the optical layers 1501 and 1502 preferably increases with a distance from the semiconductor light-emitting stack 13, i.e. the thickness of the outer layer is thicker than that of the inner layer. In this embodiment, the thickness of the optical layer 1502 is thicker than that of the optical layer 1501. The thickness variation of the optical layers 1501 and 1502 can release the thermal stress caused by the semiconductor light-emitting device 10 on the protection structure 15 so as to prevent the protection structure 15 from cracking. The plurality of optical layers 1501 and 1502 can be diffuser, light-gathering layer, i.e. lens, or other structure capable of adjusting light emitting properties of the semiconductor light-emitting device 10.

The semiconductor light-emitting device 10 further has a reflective layer 16 for reflecting light moving towards the light-impervious layer 11 and guiding light to the fluorescent material structure 14. The reflective layer 16 can be disposed between the bonding structure 12 and the light-impervious layer 11, and therefore the bonding structure 12 is transparent, as show in FIG. 4. In other hand, the reflective layer 16 can be disposed between the bonding structure 12 and the semiconductor light-emitting stack 13, as shown in FIG. 5. Moreover, the reflective layer 16, such as a Bragg reflector, can be formed within the semiconductor light-emitting stack 13 (not shown).

The material of the reflective layer 16 is such as metal, oxide, a combination of above materials, or other materials for reflecting light. Preferably, the reflective layer 16 comprises a material selected from a group consisting of In, Sn, Al, Au, Pt, Zn, Ag, Ti, Pb, Ge, Cu, Ni, AuBe, AuGe, AuZn, PbSn, $SiN_x$, $SiO_2$, $Al_2O_3$, $TiO_2$, and MgO.

The semiconductor light-emitting stack 13 of the present invention further comprises a transparent conductive layer (not shown) for spreading current, or for forming an ohmic contact with other layers, such as p type semiconductor layer or n type semiconductor layer. The material of the transparent conductive layer is indium tin oxide (ITO), cadmium tin oxide (CTO), antimony tin oxide, zinc oxide, zinc tin oxide, Ni/Au, NiO/Au, TiWN, or transparent metal layer.

Embodiment 3

Please refer to FIGS. 1 to 5 again. The method for manufacturing the semiconductor light-emitting device 10 of the present invention comprises steps for separating the semiconductor light-emitting stack 13 from a growth substrate (not shown), bonding the semiconductor light-emitting stack 13 to the light-impervious substrate 11, and forming the fluorescent material structure 14 over the semiconductor light-emitting stack 13. The bonding step is to form a bonding structure between the semiconductor light-emitting stack 13 and the light-impervious substrate 11. Alternatively, the bonding step is to directly bond the semiconductor light-emitting stack 13 to the light-impervious layer 11 at a predetermined temperature and pressure, such as 500° C.~1000° C., preferably 550° C.~650° C., and 200 $g/cm^2$~400 $g/cm^2$. The bonding structure 12 can be an adhesive layer (not shown) for gluing the semiconductor light-emitting stack 13 and the light-impervious layer 11 under a predetermined temperature, such as 150° C.~600° C., preferably 200° C.~300° C., and a predetermined pressure, such as 328 $g/cm^2$~658 $g/cm^2$, preferably about 505 $g/cm^2$. The bonding structure 12 can also be a metal layer (not shown), which is bonded with the semiconductor light-emitting stack 13 and the light-impervious layer 11 at an appropriate temperature, such as 200° C.~600° C., and pressure. The metal layer can also serve as a mirror for reflecting light.

Preferably, the bonding step comprises forming the first intermediate layer 1201 over the light-impervious layer 11, forming the second intermediate layer 1203 over the semiconductor light-emitting stack 13, and bonding the semiconductor light-emitting stack 13 and the light-impervious layer 11 via the adhesive layer 1202. The adhesive layer 1202 is formed between the first and second intermediate layers 1201 and 1203. The first and second intermediate layers 1201 and 1203 can enhance the bonding strength between the adhesive layer 1202 and the semiconductor light-emitting stack 13, and between the adhesive layer 1202 and the light-impervious layer 11.

The fluorescent material structure 14 is preferably formed over the semiconductor light-emitting stack 13 by sedimentation of the fluorescent material 1401, or by the mixture of the fluorescent material 1401 and a binder, such as epoxy.

A protection structure 15 can also be formed over the fluorescent material structure 14. The protection structure 15 can include a plurality of layers 1501 and 1502 so as to protect other structures below the protection structure 15 from the humidity and shock, or release the thermal stress occurred at high temperature.

Moreover, the present invention forms the reflective layer 16 between the light-impervious substrate 11 and the bonding structure 12, or between the bonding structure 12 and the semiconductor light-emitting stack 13. Alternatively, the reflective layer 16, such as a Bragg reflective layer, is formed within the semiconductor light-emitting stack 13 to reflect light.

Additionally, the fluorescent material structure 14 can be formed on a wafer or a chip. If the fluorescent material structure 14 is formed on the wafer, a trench 1302 is designed on the semiconductor light-emitting stack 13, and then the fluorescent material structure 14 is formed over the semiconductor light-emitting stack 13. Then, the wafer is diced by the trench 1302 after the formation of the fluorescent material structure 14 or the protection structure 15, such that the chips of the semiconductor light-emitting devices 10 are made.

It will be obvious to those skilled in the art that changes and modifications may be made to the embodiments of the present invention without departing from the invention in its broader aspects and, therefore, the appended claims are to encompass within their scope all such changes and modifications as fall within the spirit and scope of this invention.

What is claimed is:
1. A semiconductor light-emitting device comprising:
a light-impervious substrate;
a bonding structure;
two or more semiconductor light-emitting stacks, partitioned by a trench, for emitting original light, wherein each of the semiconductor light-emitting stacks is separated from a growth substrate and bonded to the light-impervious substrate through the bonding structure;

a wavelength-converting structure formed of a single layer continuously overlaying top and side surfaces of the semiconductor light-emitting stacks and top surface of the bonding structure under said trenches, the wavelength-converting structure having an outer surface being in contour conformity with the top and side surfaces of the semiconductor light-emitting stacks;

first electrical connections formed on the top surface of the light emitting stacks, the electrical connections penetrating through the wavelength-converting structure; and a protection structure formed on top of the wavelength-converting structure, the protection structure including a plurality of optical layers wherein thicknesses of the plurality of optical layers increase with their respective distance from the semiconductor light emitting stacks.

2. The semiconductor light-emitting device of claim 1, further comprising second electrical connections formed on a same side of the light-impervious substrate.

3. The semiconductor light-emitting device of claim 1, wherein the light-impervious substrate includes a transparent substrate.

4. The semiconductor light-emitting device of claim 1, further comprising a diffuser contacting the wavelength-converting structure.

* * * * *